(12) United States Patent
Sugita et al.

(10) Patent No.: US 6,576,393 B1
(45) Date of Patent: Jun. 10, 2003

(54) COMPOSITION FOR RESIST UNDERLAYER FILM AND METHOD FOR PRODUCING THE SAME

(75) Inventors: Hikaru Sugita, Mie-ken (JP); Akio Saito, Mie-ken (JP); Kinji Yamada, Ibaraki-ken (JP); Michinori Nishikawa, Ibaraki-ken (JP); Yoshihisa Ohta, Mie-ken (JP); Yoshiji Yuumoto, Mie-ken (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/545,453

(22) Filed: Apr. 7, 2000

(30) Foreign Application Priority Data

Apr. 12, 1999 (JP) .......................... 11-103689
Jun. 10, 1999 (JP) .......................... 11-163215

(51) Int. Cl.$^7$ .......................... G03C 1/73; G03C 1/825
(52) U.S. Cl. .......................... 430/270.1; 430/272.1; 430/905; 430/914; 430/919; 430/921; 430/923; 430/925
(58) Field of Search .......................... 430/270.1, 272.1, 430/914, 905, 919, 921, 923, 925

(56) References Cited

U.S. PATENT DOCUMENTS

| | | | | |
|---|---|---|---|---|
| 5,204,143 A | * | 4/1993 | Nishimiya et al. .......... | 427/387 |
| 5,409,963 A | | 4/1995 | Takeoka ...................... | 522/31 |
| 5,457,003 A | * | 10/1995 | Tanaka et al. ............... | 430/176 |

FOREIGN PATENT DOCUMENTS

| | | |
|---|---|---|
| EP | 0 391 365 A1 | 10/1990 |
| EP | 0 592 139 A1 | 4/1994 |
| JP | 05-121311 | 5/1993 |
| JP | 05-144718 | 6/1993 |
| JP | 05-217883 | 8/1993 |
| JP | 07221085 | 12/1995 |
| JP | 8-302284 * | 11/1996 |
| JP | 08-302284 A | 3/1997 |
| WO | WO 96/15861 A | 5/1996 |
| WO | WO 98/40439 A | 9/1998 |

OTHER PUBLICATIONS

U.S. patent application Ser. No. 09/545,453, filed Apr. 07, 2000, pending.
U.S. patent application Ser. No. 09/585,275, filed Jun. 02, 2000, pending.
Full English translation of Inoue et al (JP 8–302284) which was published on Nov. 19, 1996.*
Derwent Abstract :1997–048605 →English abstract for JP 8–302284, 1996.*
Machme–Assisted English Translation for JP 8–302284 (obtained from Japan Patent Office), 1996.*

* cited by examiner

Primary Examiner—Rosemary Ashton
Assistant Examiner—Sin J. Lee
(74) Attorney, Agent, or Firm—Oblon, Spivak, McClelland, Maier & Neustadt, P.C.

(57) ABSTRACT

Disclosed are a composition for a resist underlayer film excellent in reproducibility of a resist pattern, excellent in adhesion to a resist, excellent in resistance to a developing solution used after exposure of the resist and decreased in film loss in oxygen ashing of the resist; and a method for producing the same, the composition comprising:

both or either of a hydrolysate and a condensate of (A) at least one compound selected from the group consisting of (A-1) a compound represented by the following general formula (1):

$$R^1{}_a Si(OR^2)_{4-a} \qquad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^3{}_b(R^4O)_{3-b}Si{-}(R^7)_d{-}Si(OR^5)_{3-c}R^6{}_c \qquad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or $-(CH_2)n-$, d represents 0 or 1, and n represents an integer of 1 to 6; and (B) a compound generating an acid by ultraviolet irradiation and/or heating.

21 Claims, No Drawings

COMPOSITION FOR RESIST UNDERLAYER FILM AND METHOD FOR PRODUCING THE SAME

FIELD OF THE INVENTION

The present invention relates to a composition for a resist underlayer film and a method for producing the same. More particularly, the present invention relates to a composition for a resist underlayer film excellent in reproducibility of a resist pattern, excellent in adhesion to a resist, excellent in resistance to a developing solution used after exposure of the resist and decreased in film loss in oxygen ashing of the resist, and a method for producing the same.

BACKGROUND OF THE INVENTION

In pattern formation of semiconductor elements, minute processing of organic materials and inorganic materials is carried out by lithography techniques, resist development processes and pattern transfer after the resist development.

However, with the progress of high integration of semiconductor elements, it becomes difficult to accurately transfer patterns to resists in exposure processes, sometimes resulting in wrong processing dimensions in substrate processing processes. Then, anti-reflection films for reducing the influence of standing waves contributing to the wrong processing dimensions become indispensable in minute processing processes. Such anti-reflection films include underlayer anti-reflection films formed between resists and substrates.

On the other hand, when substrates such as silicon oxide films are processed, resist patterns are used as masks. The resist film thickness decreases with miniaturization, so that the masking property of the resists becomes insufficient. It becomes therefore difficult to process the substrates without damaging them. Then, a process is employed in which a resist pattern is first transferred to an underlayer film for processing a substrate, followed by dry etching of the substrate using the underlayer film as a mask. The term "underlayer film for processing the substrate" means a film also serving as the underlayer anti-reflection film or a film formed under the anti-reflection film. In this process, the etching rate of the resist is close to that of the underlayer film for processing the substrate. It is therefore necessary to form a mask for processing the underlayer film (a resist underlayer film) between the resist and t e underlayer film. That is to say, a multilayer film composed of the underlayer film for processing the substrate, the resist underlayer film and the resist is formed on the substrate.

The characteristics required for the resist underlayer films are that the resist patterns having no footing can be formed, that the resist underlayer films are excellent in adhesion to the resists, and that when the underlayer films for processing the substrates are processed, the resist underlayer films have the sufficient masking property. However, materials meeting all of these requirements have not been discovered yet.

SUMMARY OF THE INVENTION

An object of the invention is to provide a composition for a resist underlayer film which is not separated from a resist, improves the reproducibility of a resist pattern, and has the resistance to oxygen ashing in removing an alkali and the resist by providing the resist underlayer film under the resist for solving the problems described above.

Another object of the invention is to provide a method for producing the above-mentioned composition.

According to the invention, there is provided a composition for a resist underlayer film comprising:

both or either of a hydrolysate and a condensate of (A) at least one compound (hereinafter referred to as compound (1)) selected from the group consisting of (A-1) a compound represented by the following general formula (1):

$$R^1_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^2_b(R^4O)_{3-b}Si-(R^7)_d-Si(OR^5)_{3-c}R^6_c \quad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or —$(CH_2)n$—, d represents 0 or 1, and n represents an integer of 1 to 6; and (B) a compound generating an acid by ultraviolet irradiation and/or heating (hereinafter referred to as an "acid generating agent").

The invention further provides a method for producing the composition described above.

DESCRIPTION OF THE PREFERRED EMBODIMENTS

Component (A)

Component (A-1)

In the above-mentioned general formula (1), the univalent organic groups represented by $R^1$ and $R^2$ include alkyl, aryl, allyl and glycidyl groups. Further, in general formula (1), $R^1$ is preferably a univalent organic group, particularly an alkyl or phenyl group.

Here, the alkyl groups include methyl, ethyl, propyl and butyl, and each preferably has 1 to 5 carbon atoms. These alkyl groups may be straight-chain or branched, or hydrogen atoms may be substituted by fluorine atoms.

In general formula (1), the aryl groups include phenyl, naphthyl, methylphenyl, ethylphenyl, chlorophenyl, bromophenyl and fluorophenyl.

Specific examples of the compounds represented by general formula (1) include trimethoxysilane, triethoxy-silane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxy-silane, tetramethoxysilane, tetraethoxysilane, tetra-n-propoxysilane, tetra-iso-propoxysilane, tetra-n-butoxy-silane, tetra-sec-butoxysilane, tetra-tert-butoxysilane, tetraphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tertbutoxysilane, methyltri-phenoxysilane, ethyltrimethoxysilane, ethyltriethoxysilane, ethyltri-n-propoxysilane, ethyltriiso-propoxysilane, ethyltri-n-butoxysilane, ethyltri-sec-butoxysilane, ethyl-tri-tert-butoxysilane, ethyltriphenoxysilane, vinyltrimethoxysilane, vinyltriethoxysilane, vinyltri-n-propoxy-silane, vinyltriiso-propoxysilane, vinyltri-n-butoxy-silane, vinyltri-sec-butoxysilane, vinyltri-tert-butoxy-silane, vinyltriphenoxysilane, n-propyltrimethoxysilane, n-propyltriethoxysilane, n-propyltri-n-propoxysilane, propyltri-iso-propoxysilane, n-propyltri-n-butoxysilane, n-propyltri-sec-butoxysilane, n-propyltri-tert-butoxy-silane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, propyltri-sec-butoxysilane, i-propyltri-tert-butoxy-silane, i-propyltriphenoxysilane, n-butyltrimethoxysilane, n-butyltriethoxysilane, n-butyltri-n-propoxysilane, butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyl-i-triethoxysilane, sec-butyltri-n-propoxysilane, sec-butyltri-iso-propoxysilane, sec-butyltri-n-butoxy-silane, sec-butyltri-sec-butoxysilane, sec-butyltri-tertbutoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tertbutoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, dimethyldimethoxysilane, dimethyldiethoxysilane, dimethyldi-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-ditert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxy-silane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxy-silane, di-n-butyldi-tert-butoxysilane, di-n-butyldi-phenoxysilane, di-sec-butyldimethoxysilane, di-sec-butyl-diethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldiphenoxysilane, di-tert-butyl-dimethoxysilane, di-tert-butyl-diethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldi-methoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, divinyltri-methoxysilane, trimethylmonomethoxysilane, trimethylmono-ethoxysilane, triethylmonomethoxysilane, triethylmono-ethoxysilane, triphenylmonomethoxysilane and triphenylmonoethoxysilane.

Preferred examples of these compounds include tetramethoxysilane, tetraethoxysilane, tetra-n-propoxysilane, tetra-iso-propoxysilane, tetraphenoxysilane, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, trimethylmonomethoxysilane, trimethylmonoethoxysilane, triethylmonomethoxysilane, triethylmonoethoxysilane, triphenylmonomethoxysilane and triphenylmonoethoxysilane.

They may be used alone or in combination.

Component (A-2)

In the above-mentioned general formula (2), the univalent organic groups include organic groups similar to those previously defined in general-formula (1).

Of the compounds represented by general formula (2), the compounds in which $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-tri-methoxy-1,3,3-triphenyldisiloxane, 1,1,3-tri-ethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane. Preferred examples of these compounds include hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane.

The compounds in which d is 0 in general formula (2) include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane and 1,2-diethoxy-1,1,2,2-tetraphenyldisilane. The compounds in which $R^7$ is $—(CH_2)_n—$ in general formula (2) include bis (hexamethoxysilyl)

methane, bis(hexaethoxysilyl)methane, bis(hexaphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bisdimethoxymethylsilyl)ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(hexamethoxysilyl)propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane and 1,3-bis(ethoxydiphenylsilyl)propane. Preferred examples of these compounds include hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(hexamethoxysilyl)methane, bis(hexaethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane and bis(ethoxydiphenylsilyl)methane.

In the invention, the above-mentioned components (A-1) and (A-2), or either of them is used as component (A). The compounds of each of components (A-1) and (A-2) can be used as a combination of two or more of them.

In the invention, component (A) is preferably (1) or (2) described below, and particularly preferably (2) in that the adhesion to a resist is better.

(1) Both or either of a hydrolysate and a condensate of a compound (hereinafter referred to as compound (a1)) represented by the following general formula (3):

$$Si(OR^2)_4 \qquad (3)$$

wherein $R^2$ represents a univalent organic group, and specific examples thereof are the same as with the above-mentioned general formula (1).

(2) both or either of a hydrolysate and a condensate of a silane composition comprising a compound represented by the above-mentioned general formula (3) and a compound (hereinafter referred to as compound (a2)) represented by the following general formula (4):

$$R^1{}_nSi(OR^2)_{4-n} \qquad (4)$$

wherein $R^1$ and $R^2$, which may be the same or different, each represent univalent organic groups, specific examples thereof are the same as with general formula (1), and n represents an integer of 1 to 3.

In the case of (2) described above, the amount of compound (a2) (in terms of a completely hydrolyzed and/or condensed product) is from 0.5 part to 50 parts by weight, and more preferably from 5 part to 40 parts by weight, based on 100 parts by weight of compound (a1) (in terms of a completely hydrolyzed and/or condensed product).

Particularly preferred examples of compounds (a1) include tetramethoxysilane and tetraethoxysilane. Particularly preferred examples of compounds (a2) include methyltrimethoxysilane, methyltriethoxysilane, dimethyldimethoxysilane and di-methyldiethoxysilane.

When compound (1) is hydrolyzed and/or partially condensed, water is preferably used in an amount of 0.25 mole to 3 moles, particularly 0.3 mole to 2.5 moles, per mole of group represented by $R^1O$—, $R^4O$— or $R^5O$—. When the amount of water added is within the range of 0.3 mole to 2.5 moles, there is no fear of decreased uniformity of a coating film, and the storage stability of the composition for the resist underlayer film is less likely to deteriorate.

Specifically, water is added intermittently or continuously to an organic solvent in which compound (1) has been dissolved. In this case, a catalyst may be either previously added to the organic solvent, or dissolved or dispersed in the water in adding the water. In this case, the reaction temperature is usually from 0° C. to 100° C., and preferably from 15° C. to 80° C. Then, component (B) is added to the solution thus obtained, thereby providing the composition for the resist underlayer film of the invention.

Further, when two or more compounds are used as compound (1), (a) two or more compounds may be mixed, followed by hydrolysis and/or condensation, or (b) two or more compounds may be each separately hydrolyzed and/or condensed, followed by mixing. In particular, (b) is preferred.

Particularly, when compound (a2) is used, following two using methods are preferred.

(2-1) both or either of a hydrolysate and a condensate of a compound (a1) and both or either of a hydrolysate and a condensate of a compound (a2) are mixed to use.

(2-2) both or either of a hydrolysate and a condensate of a compound (a1) and both or either of a hydrolysate and a condensate (a co-hydrolysate and a co-condensate) obtained from mixing compound (a1) and compound (a2), followed by hydrolysis and condensation of the mixture, are mixed to use.

Further, when compound (1) is hydrolyzed and/or partially condensed, a catalyst may be used. The catalysts used in this case include metal chelate compounds, organic acids, inorganic acids, organic bases and inorganic bases.

The metal chelate compounds include compounds represented by the following general formula (6):

$$R^{11}{}_fM(OR^{12})_{g-f} \qquad (6)$$

wherein $R^{11}$ indicates a chelating agent, M indicates a metal atom, $R^{12}$ indicates an alkyl group having 2 to 5 carbon atoms or an aryl group having 6 to 20 carbon atoms, g represents a valence of the metal atom M, and f represents an integer of 1–g.

Above all, chelate compounds of titanium, aluminum or zirconium are preferred. Specific examples thereof include titanium chelate compounds such as triethoxy.mono(acetylacetonato)titanium, tri-n-propoxy.mono(acetylacetonato)titanium, tri-i-propoxy.mono(acetylacetonato)titanium, tri-n-butoxy.mono(acetylacetonato)-titanium, tri-sec-butoxy.mono(acetylacetonato)titanium, tri-t-butoxy.mono(acetylacetonato)titanium, diethoxy.bis(acetylacetonato)titanium, di-n-propoxy.bis(acetylacetonato)titanium, di-i-propoxy.bis(acetylacetonato)titanium, di-n-butoxy.bis (acetylacetonato)titanium, di-sec-butoxy.bis (acetylacetonato)titanium, di-t-butoxy.bis-(acetylacetonato) titanium, monoethoxy.tris(acetylacetonato)titanium, mono-n-propoxy.tris(acetylacetonato)titanium, mono-i-propoxy.tris(acetylacetonato)titanium, mono-n-butoxy.tris (acetylacetonato)titanium, mono-sec-butoxy.tris (acetylacetonato)titanium, mono-t-butoxy.tris (acetylacetonato)titanium, tetrakis(acetylacetonato) titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono (ethylacetoacetate)titanium, diethoxy.bis(ethylacetoacetate) titanium, di-n-propoxy.bis(ethylacetoacetate)titanium, di-i-propoxy.bis(ethylacetoacetate)titanium, di-n-butoxy.bis (ethylacetoacetate)titanium, di-sec-butoxy.bis (ethylacetoacetate)titanium, di-t-butoxy.bis (ethylacetoacetate)titanium, monoethoxy.tris (ethylacetoacetate)titanium, mono-n-propoxy.tris (ethylacetoacetate)titanium, mono-i-propoxy.tris (ethylacetoacetate)titanium, mono-n-butoxy.tris (ethylacetoacetate)titanium, mono-sec-butoxy.tris (ethylacetoacetate)titanium, mono-t-butoxy.tris (ethylacetoacetate)titanium, tetrakis(ethylacetoacetate)-titanium, mono(acetylacetonato)tris(ethylacetoacetate)-titanium, bis(acetylacetonato)bis(ethylacetoacetate)-titanium and tris(acetylacetonato)mono(ethylacetoacetate)-titanium; zirconium chelate compounds such as triethoxy.mono(acetylacetonato)zirconium, tri-n-propoxy.mono(acetylacetonato)zirconium, tri-i-propoxy.mono(acetylacetonato)zirconium, tri-n-butoxy.mono(acetylacetonato)zirconium, tri-sec-butoxy.mono(acetylacetonato)zirconium, tri-t-butoxy.mono (acetylacetonato)zirconium, diethoxy.bis(acetylacetonato) zirconium, di-n-propoxy.bis(acetylacetonato)zirconium, di-i-propoxy.bis(acetylacetonato)zirconium, di-n-butoxy.bis (acetylacetonato)zirconium, di-sec-butoxy.bis (acetylacetonato)zirconium, di-t-butoxy.bis (acetylacetonato)zirconium, monoethoxy.tris (acetylacetonato)zirconium, mono-n-propoxy.tris (acetylacetonato)zirconium, mono-i-propoxy.tris (acetylacetonato)zirconium, mono-n-butoxy.tris (acetylacetonato)zirconium, mono-sec-butoxy.tris (acetylacetonato)zirconium, mono-t-butoxy.tris (acetylacetonato)zirconium, tetrakis(acetylacetonato) zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis (ethylacetoacetate)zirconium, di-n-propoxy.bis (ethylacetoacetate)zirconium, di-i-propoxy.bis (ethylacetoacetate)zirconium, di-n-butoxy.bis (ethylacetoacetate)zirconium, di-sec-butoxy.bis (ethylacetoacetate)zirconium, di-t-butoxy.bis (ethylacetoacetate)zirconium, monoethoxy.tris (ethylacetoacetate)zirconium, mono-n-propoxy.tris (ethylacetoacetate)zirconium, mono-i-propoxy.tris (ethylacetoacetate)zirconium, mono-n-butoxy.tris (ethylacetoacetate)zirconium, mono-sec-butoxy.tris (ethylacetoacetate)zirconium, mono-t-butoxy.tris (ethylacetoacetate)zirconium, tetrakis(ethylacetoacetate) zirconium, mono(acetylacetonato)tris(ethylacetoacetate) zirconium, bis(acetylacetonato)bis(ethylacetoacetate) zirconium and tris(acetylacetonato)mono(ethylacetoacetate) zirconium; and aluminum chelate compounds such as tris (acetylacetonato)aluminum and tris(ethylacetoacetate) aluminum.

The organic acids include, for example, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid. Oxalic acid and maleic acid are particularly preferred.

The inorganic acids include, for example, hydrochloric acid, nitric acid, sulfuric acid, hydrofluoric acid and phosphoric acid.

The organic bases include, for example, pyridine, pyrrole, piperazine, pyrrolidine, piperidine, picoline, trimethylamine, triethylamine, monoethanolamine, di-ethanolamine, dimethylmonoethanolamine, monomethyldi-ethanolamine, triethanolamine, diazabicyclooctane, diaza-bicyclononane, diazabicycloundecene and tetramethylammonium hydroxide.

The inorganic bases include, for example, ammonia, sodium hydroxide, potassium hydroxide, barium hydroxide and calcium hydroxide. Of these catalysts, the metal chelate compounds, the organic acids and the inorganic acids are preferred, and the titanium chelate compounds and the organic acids are more preferred. They may be used either alone or in combination.

The amount of the above-mentioned catalysts used is usually from 0.001 part to 10 parts by weight, and preferably from 0.01 part to 10 parts by weight, based on 100 parts by weight of component (A) (in terms of a completely hydrolyzed and/or condensed product).

Component (B)

In the invention, the acid generating agents include latent thermoacid generating agents and latent photoacid generating agents.

The latent thermoacid generating agents are compounds generating acids by heating them usually to 50° C. to 450° C., preferably to 200° C. to 350° C., and onium salts such as sulfonium salts, benzothiazolium salts, ammonium salts and phosphonium salts are used.

Specific examples of the above-mentioned sulfonium salts include alkyl sulfonium salts such as 4-acetophenyldimethylsulfonium hexafluoroantimonate, 4-acetoxyphenyldimethylsulfonium hexafluoroarsenate, dimethyl-4-(benzyloxycarbonyloxy)phenylsulfonium hexafluoroantimonate, dimethyl-4-(benzoyloxy) phenylsulfonium hexafluoroantimonate, dimethyl-4-(benzoyloxy)phenylsulfonium hexafluoroarsenate and dimethyl-3-chloro-4-acetoxyphenylsulfonium hexafluoroantimonate; benzylsulfonium salts such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methylphenylmethylsulfonium hexafluoro-antimonate, benzyl-2-methyl-4-hydroxyphenylmethylsulfonium hexafluoroantimonate, benzyl-3-chloro-4-hydroxyphenylmethylsulfonium hexafluoroarsenate, 4-methoxybenzyl-4-hydroxyphenylmethylsulfonium hexafluorophosphate, benzoin tosylate and 2-nitrobenzyl tosylate; dibenzylsulfonium salts such as dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate and benzyl-4-methoxybenzyl-4-hydroxyphenylsulfonium hexafluorophosphate; and substituted benzyl sulfonium salts such as p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl-3-methyl-4-hydroxyphenylmethylsulfonium hexafluoroantimonate, 3,5-dichlorobenzyl-4-hydroxyphenylmethylsulfonium hexafluoro-antimonate and o-chlorobenzyl-3-chloro-4-hydroxyphenyl-methylsulfonium hexafluoroantimonate.

Specific examples of the above-mentioned benzothiazonium salts include benzylbenzothiazolium salts such as 3-benzylbenzothiazolium hexafluoroantimonate, 3-benzylbenzothiazolium hexafluorophosphate, 3-benzylbenzothiazolium tetrafluoroborate, 3-(p-methoxybenzyl)benzothiazolium hexafluoroantimonate, 3-benzyl-2-methylthiobenzothiazolium hexafluoroantimonate and 3-benzyl-5-chlorobenzothiazolium hexafluoroantimonate.

Further, as an example of the thermoacid generating agent other than the above, 2,4,4,6-tetrabromocyclohexadienone can be shown.

Of these, 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenyldibenzylsulfonium hexafluoroantimonate and 3-benzylbenzothiazolium hexafluoroantimonate are preferably used. Commercial products of these compounds include San-Aid SI-L85, SI-L110, SI-L145, SI-L150 and SI-L160 (manufactured by SanShin Chemical Industry Corp.).

These compounds can be used alone or as a combination of two or more of them.

The latent photoacid generating agents used in the invention are compounds generating acids by irradiation of ultraviolet rays usually at 1 mJ to 100 mJ, preferably at 10 mJ to 50 mJ.

The photoacid generating agents include, for example, onium salt photoacid generating agents such as diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-t-butylphenyl)iodonium trifluoromethanesulfonate, bis(4-t-butylphenyl)iodonium dodecylbenzenesulfonate, bis-(4-t-butylphenyl)iodonium naphthalenesulfonate, bis(4-t-butylphenyl)iodonium hexafluoroantimonate, bis(4-t-butylphenyl)iodonium nonafluoro-n-butanesulfonate, triphenylsulfonium trifluoromethanesulfonate, triphenylsulfonium hexafluoroantimonate, triphenylsulfonium naphthalenesulfonate, triphenylsulfonium nonafluoro-n-butanesulfonate, (hydroxyphenyl)benzenemethylsulfonium toluenesulfonate, cyclohexylmethyl(2-oxocyclohexyl)sulfonium trifluoromethanesulfonate, dicyclohexyl(2-oxocyclohexyl)sulfonium trifluoromethanesulfonate, dimethyl(2-oxocyclohexyl)sulfonium trifluoromethanesulfonate, diphenyliodonium hexafluoroantimonate, triphenylsulfonium camphorsulfonate, (4-hydroxyphenyl)benzylmethylsulfonium toluenesulfonate, 1-naphthyldimethylsulfonium trifluoromethanesulfonate, 1-naphthyldiethylsulfonium trifluoromethanesulfonate, 4-cyano-1-naphthyldimethylsulfonium trifluoromethanesulfonate, 4-nitro-1-naphthyldimethylsulfonium trifluoromethanesulfonate, 4-methyl-1-naphthyldimethylsulfonium trifluoromethanesulfonate, 4-cyano-1-naphthyldiethylsulfonium trifluoromethanesulfonate, 4-nitro-1-naphthyldiethylsulfonium trifluoromethanesulfonate, 4-methyl-1-naphthyldiethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-methoxymethoxy-1-naphthyltetrahydrothiophenium trifluoromethanesulfonate, 4-ethoxymethoxy-1-naphthyltetrahydrothiophenium trifluoromethanesulfonate, 4-(1-methoxyethoxy)-1-naphthyltetrahydrothiophenium trifluoromethanesulfonate, 4-(2-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothiophenium trifluoromethanesulfonate, 4-i-propoxycarbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethanesulfonate, 4-(2-tetrahydrofuranyloxy)-1-naphthyltetrahydrothiophenium trifluoromethanesulfonate, 4-(2-tetrahydropyranyloxy)-1-naphthyltetrahydrothiophenium trifluoromethanesulfonate, 4-benzyloxy-1-naphthyltetrahydrothiophenium trifluoromethanesulfonate, 1-(naphthylacetomethyl)tetrahydrothiophenium trifluoromethanesulfonate, diphenyl-4-methoxyphenylsulfonium nonafuloro-n-butanesulfonate, diphenyl-4-methoxyphenylsulfonium trifuloromethanesulfonate, diphenyl-4-methylphenylsulfonium trifuloromethanesulfonate, diphenyl-4-tert-butyl-sulfonium perfluorooctanesulfonate, pyrogallol tristrifluoromethanesulfonate, nitrobenzyl-9,10-diethoxyanthracene-2-sulfonate and N-hydroxysuccinimide trifluoromethanesulfonate; halogen-containing photoacid generating agents such as phenyl-bis(tri-chloromethyl)-s-triazine, methoxyphenyl-bis(trichloro-methyl)-s-triazine and naphthyl-bis(trichloromethyl)-s-triazine; diazoketone photoacid generating agents such as 1,2-naphthoquinonediazido-4-sulfonyl chloride, 1,2-naphthoquinonediazido-5-sulfonyl chloride and 1,2-naphthoquinonediazido-4-sulfonic ester or 1,2-naphthoquinonediazido-5-sulfonic ester of 2,3,4,4'-tetrabenzophenone; sulfone photoacid generating agents such as 4-trisphenacylsulfone, mesitylphenacylsulfone and bis-(phenylsulfonyl)methane; and sulfonic acid compound photoacid generating agents such as benzoin tosylate, trifluoromethanesulfonylbicyclo-[2,2,1]hepto-5-ene-2,3- dicarbodiimide and 1,8-naphthalenedi-carboxylic acid imide trifluoromethanesulfonate.

They can be used alone or as a combination of two or more of them.

Particularly preferred examples of these acid generating agents include triphenylsulfonium trifluoromethanesulfonate, triphenylsulfonium nonafluoro-n-butanesulfonate, diphenyl-4-methoxyphenylsulfonium nonafuloro-n-butanesulfonate, diphenyl-4-methoxyphenylsulfonium trifuloromethanesulfonate, diphenyl-4-methylphenylsulfonium trifuloromethanesulfonate and diphenyl-4-tert-butylsulfonium perfluorooctanesulfonate.

The resist underlayer film composition of the invention comprises component (A) and component (B) dissolved or dispersed in an organic solvent.

The organic solvents used in the invention include, for example, aliphatic hydrocarbon solvents such as n-pentane, i-pentane, n-hexane, i-hexane, n-heptane, i-heptane, 2,2,4-trimethylpentane, n-octane, i-octane, cyclohexane and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene and trimethylbenzene; monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol; polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol and glycerol; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone and fenchone; ether solvents such as ethyl ether, i-propyl ether, n-butyl ether, n-hexyl ether, 2-ethyl hexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monobutyl ether, dipropylene glycol monomethyl ether, dipropylene glycol monoethyl ether, tripropylene glycol monomethyl ether, tetrahydrofuran and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide and N-methylpyrrolidone; and sulfur-containing solvents such as dimethyl sulfide, diethyl sulfide, thiophene, tetrahydrothiophene, dimethyl sulfoxide, sulfolane and 1,3-propanesultone. They can be used alone or as a mixture of two or more of them.

In the invention, it is particularly preferable to use solvents represented by the following general formula (5):

$$R^8O(R^{10}O)_eR^9 \qquad (5)$$

wherein $R^8$ and $R^9$ each independently represent hydrogen atoms or univalent organic groups selected from the group consisting of alkyl groups each having 1 to 4 carbon atoms and $CH_3CO-$, $R^{10}$ represents an alkylene group having 2 to 4 carbon atoms, and e represents an integer of 1 or 2.

Preferred examples of the solvents represented by general formula (5) include propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate and propylene glycol. Propylene glycol monomethyl ether, propylene glycol monoethyl ether, propylene glycol monopropyl ether, propylene glycol monoisopropyl ether, propylene glycol monobutyl ether, propylene glycol dimethyl ether, propylene glycol diethyl ether, propylene glycol monomethyl ether acetate, propylene glycol monoethyl ether acetate and propylene glycol monopropyl ether acetate are preferred in respect to the solution storage stability. Particularly preferred are propylene glycol monomethyl ether, propylene glycol monoethyl ether, propylene glycol monopropyl ether, propylene glycol monoisopropyl ether and propylene glycol monobutyl ether. They can be used alone or as a mixture of two or more of them.

The compositions for the resist underlayer films of the invention contain the above-mentioned organic solvent.

However, when compound (1) is hydrolyzed and/or partially condensed, similar solvents can be used. In particular, it is preferred that compound (1) is hydrolyzed and/or partially condensed in the presence of the solvents represented by the above-mentioned formula (5).

In the composition of the invention, the content of an alcohol having a boiling point of 100° C. or less is preferably 2% by weight or less, and more preferably 1% by weight or less, from the viewpoint of uniformity of a coating film. The alcohol having a boiling point of 100° C. or less is sometimes generated in hydrolyzing and/or condensing compound (1). It is therefore preferred that the alcohol is removed by distillation so as to give an alcohol content of 2% by weight or less, preferably 1% by weight or less.

Further, when the composition for the resist underlayer film of the invention is prepared, water is preferably added in an amount of 0.2 part to 10 parts by weight based on 100 parts by weight of the whole composition. When the water content is less than 0.2 part by weight or exceeds 10 parts by weight, the storage stability of the composition is deteriorated in some cases.

Furthermore, the amount of sodium and iron contained in the composition is preferably 20 ppb or less, and particularly preferably 15 ppb or less, from the viewpoint of resolution of the resist. The composition is sometimes contaminated with sodium and iron derived from raw materials used, so that the raw materials are preferably purified by distillation or the like.

The ratio of component (B) used in the composition for the resist underlayer film of the invention is preferably from 1 part to 30 parts by weight, and more preferably from 1 part to 10 parts by weight, based on 100 parts by weight of component (A) (in terms of a completely hydrolyzed and/or condensed product). A component (B) content of less than 1 part by weight results in increased resist patterns having footing, whereas exceeding 30 parts by weight causes an increase in undercut of the resist patterns.

The compositions for the resist underlayer films of the invention may further contain the following components.

β-Diketone

Examples of the β-diketones include acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione and 1,1,1,5,5,5-hexafluoro-2,4-heptanedione. They may be used alone or in combination.

In the invention, the amount of the β-diketone contained in the composition for film formation is preferably from 1% to 50% by weight, and more preferably from 3% to 30% by weight, based on the whole solvent.

The addition of the β-diketone within such a range gives certain storage stability, and is less likely to deteriorate characteristics such as coating film uniformity of the composition for film formation.

Others

The compositions for film formation obtained in the invention may further contain components such as colloidal silica, colloidal alumina, organic polymers and surfactants.

Colloidal silica is, for example, a dispersion in which high-purity silicic acid anhydride is dispersed in the above-mentioned hydrophilic organic solvent. The mean particle size thereof is usually from 5 μm to 30 μm, and preferably from 10 μm to 20 μm, and the solid content thereof is from about 10% to about 40% by weight. Such colloidal silica includes, for example, Methanol Silica Sol and Isopropanol Silica Sol manufactured by Nissan Chemical Industries Ltd., and Oscal manufactured by Catalysts & Chemicals Industries Co., Ltd.

Colloidal alumina includes Alumina Sol 520, 100 and 200 manufactured by Nissan Chemical Industries Ltd., and Alumina Clear Sol, Alumina Sol 10 and 132 manufactured by Kawaken Fine Chemicals Co., Ltd.

Examples of the organic polymers include compounds having polyalkylene oxide structures, compounds having sugar chain structures, vinylamide polymers, (meth)acrylate compounds, aromatic vinyl compounds, dendrimers, polyimides, polyamic acids, polyarylenes, polyamides, polyquinoxalines, polyoxadiazoles and fluorine polymers.

The surfactants include, for example, noionic surfactants, anionic surfactants, cationic surfactants and amphoteric surfactants, and further silicone surfactants, polyalkylene oxide surfactants and fluorine-containing surfactants.

This invention will be illustrated with reference to examples in more details below, but the following disclosure shows preferred embodiments of the invention and is not intended to limit the scope of the invention.

The compositions for the resist underlayer films are evaluated by the following methods.

Evaluation of Adhesion of Resist

NFC B007 manufactured by JSR Corporation was applied onto a silicon wafer by spin coating to form an antireflection film, and dried on a hot plate at 190° C. for 1 minute. Then, a resist underlayer film was formed, and a resist (PFR3650 manufactured by JSR Corporation) was applied onto the resist underlayer film, followed by drying at 100° C. for 1 minute. Through a quartz mask having a line-and-space pattern of 0.5 μm, i-rays were irradiated for 15 seconds. On a substrate after development with a 2.38% aqueous solution of tetramethylammonium hydroxide for 1 minute, a resist pattern was observed under an SEM. When no development separation occurred, it was evaluated as "no separation".

Evaluation of Reproducibility of Resist Pattern

NFC B007 manufactured by JSR Corporation was applied onto a silicon wafer by spin coating to form an antireflection film, and dried on a hot plate at 190° C. for 1 minute. Then, a resist underlayer film was formed, and a resist (PFR3650 manufactured by JSR Corporation) was applied onto the resist underlayer film, followed by drying at 100° C. for 1 minute. Through a quartz mask having a line-and-space pattern of 0.5 μm, i-rays were irradiated for 15 seconds. On a substrate after development with a 2.38% aqueous solution of tetramethylammonium hydroxide for 1 minute, a resist pattern was observed under an SEM. When the resist did not remain undeveloped in an exposed area and a rectangle was reproduced, it was evaluated as "good".

Evaluation of Alkali Resistance

A resist underlayer film was immersed in a 2.38% aqueous solution of tetramethylammonium hydroxide for 1 minute. When the change in coating film thickness before and after the immersion was 1 nm or less, it was evaluated as "good".

Resistance to Oxygen Ashing

A resist underlayer film was treated with $O_2$ at 200 W for 15 seconds by using a barrel type oxygen plasma ashing system (PR-501A manufactured by Yamato Scientific Co., Ltd.). When the change in film thickness before and after the treatment was 3 nm or less, it was evaluated as "good".

EXAMPLE 1

(1) In 298 g of propylene glycol monopropyl ether, 106.4 g of tetramethoxysilane was dissolved. Then, the resulting solution was stirred with a three-one motor and the temperature of the solution was maintained at 60° C. Thereafter, 50 g of ion-exchanged water in which 2.1 g of maleic acid was dissolved was added to the solution for 1 hour. After reaction at 60° C. for 4 hours, the reaction solution was cooled to room temperature. Then, 90 g of a solution containing methanol was removed from the reaction solution by evaporation at 50° C., followed by addition of 643 g of propylene glycol monopropyl ether. Thus, solution (A) was obtained.

(2) To solution (A), 5 g of bis (4-t-butylphenyl) iodonium camphorsulfonate was added as component (B) to obtain a composition for a resist underlayer film.

The resulting composition was filtered through a Teflon filter having a pore size of 0.2 μm.

(3) NFC B007 manufactured by JSR Corporation was applied onto a silicon wafer by the spin coat process to form an antireflection film, and dried on a hot plate at 190° C. for 1 minute. Then, the composition obtained in (2) described above was applied onto the antireflection film by the spin coat process, and dried on a hot plate at 200° C. for 2 minute to form a resist underlayer film. The thickness of the resulting resist underlayer film was measured with an optical thickness meter. As a result, the thickness thereof was 70 nm.

(4) Results of Evaluation

Adhesion of Resist: No separation

Reproducibility of Resist Pattern: Good

Alkali Resistance: Good (the change in film thickness: 0.1 nm)

Resistance to Oxygen Ashing: Good (the change in film thickness: 2.5 nm)

EXAMPLE 2

Synthesis Example 1

In 359 g of propylene glycol monopropyl ether, 107.7 g of tetramethoxysilane was dissolved. Then, the resulting solution was stirred with a three-one motor and the temperature of the solution was maintained at 60° C. Thereafter, 42 g of ion-exchanged water in which 2.5 g of maleic acid was dissolved was added to the solution for 1 hour. After reaction at 60° C. for 4 hours, the reaction solution was cooled to room temperature. To this reaction solution, 136 g of propylene glycol monopropyl ether was added, and 136 g of a solution containing methanol was removed from the reaction solution by evaporation at 50° C. to obtain solution (A-1).

Synthesis Example 2

Reaction solution (B-1) was obtained in the same manner as with Synthesis Example 1, with the exception that 96.4 g of methyltrimethoxysilane was used in place of tetramethoxysilane. (1) Reaction solution (A-1) (95 g) obtained in Synthesis Example 1, 5 g of reaction solution (B-1) obtained in Synthesis Example 2 and 0.3 g of triphenylsulfonium trifluoromethanesulfonate were mixed and thoroughly stirred. The resulting solution was filtered through a Teflon filter having a pore size of 0.2 μm, applied onto a silicon wafer by the spin coat process, and dried on a hot plate at 350° C. for 2 minutes. The thickness of the resulting coating film was measured with an optical thickness meter. As a result, the thickness thereof was 95 nm.

(2) Results of Evaluation

Adhesion of Resist: No separation

Reproducibility of Resist Pattern: Good

Alkali Resistance: Good (the change in film thickness: 0.3 nm)

Resistance to Oxygen Ashing: Good (the change in film thickness: 1.8 nm)

EXAMPLE 3

Synthesis Example 3

Reaction solution (B-2) was obtained in the same manner as with Synthesis Example 2, with the exception that 0.4 g of isopropoxytitanium tetraethylacetylacetate was used in place of maleic acid and previously mixed with methyltrimethoxysilane.

(1) A composition for a resist underlayer film was prepared and applied to form a coating film in the same manner as with Example 2, with the exception that reaction solution (B-2) obtained in Synthesis Example 3 was used in place of reaction solution (B-1). The thickness of the resulting coating film was measured with an optical thickness meter. As a result, the thickness thereof was 70 nm.

(2) Results of Evaluation

Adhesion of Resist: No separation

Reproducibility of Resist Pattern: Good

Alkali Resistance: Good (the change in film thickness: 0.5 nm)

Resistance to Oxygen Ashing: Good (the change in film thickness: 1.6 nm)

EXAMPLE 4

Synthesis Example 4

In 359 g of propylene glycol monopropyl ether, 59.8 g of tetramethoxysilane and 47.9 g of methyltrimethoxysilane was dissolved. Then, the resulting solution was stirred with a three-one motor and the temperature of the solution was maintained at 60° C. Thereafter, 42 g of ion-exchanged water in which 2.5 g of maleic acid was dissolved was added to the solution for 1 hour. After reaction at 60° C. for 4 hours, the reaction solution was cooled to room temperature. To this reaction solution, 136 g of propylene glycol monopropyl ether was added, and 136 g of a solution containing methanol was removed from the reaction solution by evaporation at 50° C. to obtain solution (B-3).

(1) A composition for a resist underlayer film was prepared and applied to form a coating film in the same manner as with Example 2, with the exception that reaction solution (B-3) obtained in Synthesis Example 4 was used in place of reaction solution (B-1). The thickness of the resulting coating film was measured with an optical thickness meter. As a result, the thickness thereof was 95 nm.

(2) Results of Evaluation

Adhesion of Resist: No separation

Reproducibility of Resist Pattern: Good

Alkali Resistance: Good (the change in film thickness: 0.3 nm)

Resistance to Oxygen Ashing: Good (the change in film thickness: 1.8 nm)

COMPARATIVE EXAMPLE 1

(1) A composition for a resist underlayer film was prepared, and applied to form a coating film, followed by evaluation, in the same manner as with Example 1, with the exception that bis (4-t-butylphenyl) iodonium camphorsulfonate was not added to solution (A). The thickness of the resulting coating film was measured with an optical thickness meter. As a result, the thickness thereof was 70 nm.

(2) Results of Evaluation

Adhesion of Resist: Separation was observed.

Reproducibility of Resist Pattern: Poor (the resist pattern had footing.)

Alkali Resistance: Good (the change in film thickness: 0.1 nm)

Resistance to Oxygen Ashing: Good (the change in film thickness: 2.5 nm)

The compositions for the resist underlayer films of the invention are excellent in reproducibility of the resist patterns, excellent in adhesion to the resists, excellent in resistance to the developing solutions used after exposure of the resists, and decreased in film loss in oxygen ashing of the resists.

What is claimed is:

1. A resist underlayer film comprising:

both or either of a hydrolysate and a condensate of (A) at least one compound selected from the group consisting of (A-1) a compound represented by the following general formula (1):

$$R^1{}_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

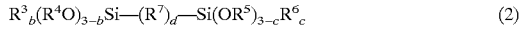

$$R^3{}_b(R^4O)_{3-b}Si-(R^7)_d-Si(OR^5)_{3-c}R^6{}_c \quad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or $-(CH_2)n-$, d represents 0 or 1, and n represents an integer of 1 to 6, wherein neither the compound of general formula (1) nor the compound of general formula (2) contains a glycidyl group; and (B) a compound generating an acid by ultraviolet irradiation and/or heating.

2. A composition for a resist underlayer film comprising:

both or either of a hydrolysate and a condensate of (A) at least one compound selected from the group consisting of (A-1) a compound represented by the following general formula (1):

$$R^1{}_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

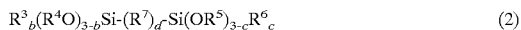

$$R^3{}_b(R^4O)_{3-b}Si-(R^7)_d-Si(OR^5)_{3-c}R^6{}_c \quad (2)$$

wherein $R^3$, $R^4$, $R^5$ and $R^6$, which may be the same or different, each represent univalent organic groups, b and c, which may by the same or different, each represent integers of 0 to 2, $R^7$ represents an oxygen atom or $-(CH_2)_n-$, d represents 0 or 1, and n represents an interger of 1 to 6, and (B) a compound generating an acid by ultraviolet irradiation and/or heating;

in which composition (A) is both or either of a hydrolysate and a condensate of (a1) a compound represented by the following general formula (3):

$$Si(OR^2)_4 \quad (3)$$

wherein $R^2$ represents a univalent organic group.

3. The composition according to claim 2, which further comprises as component (A) both or either of a hydrolysate and a condensate of (a2) a silane compound represented by the following general formula (4):

$$R^1{}_n Si(OR^2)_{4-n} \quad (4)$$

wherein $R^1$ and $R^2$, which may be the same or different, each represent univalent organic groups, and n represents an integer of 1 to 3.

4. The composition according to claim 3, in which the content of component (a2) (in terms of a completely hydrolyzed and/or condensed product) is from 0.5 part to 50 parts by weight, based on 100 parts by weight of component (a1) (in terms of a completely hydrolyzed and/or condensed product).

5. The composition according to claim 3, in which component (a2) is at least one selected from the group consisting of methyltrimethoxysilane, methyltriethoxysilane, dimethyldimethoxysilane and dimethyldiethoxysilane.

6. The composition according to claim 2, in which component (a1) is both or either of tetramethoxysilane and tetraethoxysilane.

7. The composition according to claim 2, in which component (B) is at least one selected from the group consisting of onium salt thermoacid generating agents, onium salt photoacid generating agents, halogen-containing photoacid generating agents, diazoketone photoacid generating agents, sulfone photoacid generating agents and sulfonic acid compound photoacid generating agents.

8. The composition according to claim 2, in which the content of component (B) is from 1 part to 30 parts by weight, based on 100 parts by weight of component (A) (in terms of a completely hydrolyzed and/or condensed product).

9. The composition according to claim 2, which further comprises as an organic solvent a compound represented by the following general formula (5):

$$R^8 O(R^{10}O)_e R^9 \quad (5)$$

wherein $R^8$ and $R^9$ each independently represent hydrogen atoms or univalent organic groups selected from the group consisting of alkyl groups each having 1 to 4 carbon atoms and $CH_3CO-$, $R^{10}$ represents an alkylene group having 2 to 4 carbon atoms, and e represents an integer of 1 or 2.

10. The composition according to claim 9, in which said compound represented by general formula (5) is at least one selected from the group consisting of propylene glycol monomethyl ether, propylene glycol monoethyl ether, propylene glycol monopropyl ether, propylene glycol monoisopropyl ether and propylene glycol monobutyl ether.

11. The composition according to claim 2, which further comprises 0.2 part to 10 parts by weight of water based on 100 parts by weight of the whole composition.

12. The composition according to claim 2, in which the content of an alcohol having a boiling point of 100° C. or less is 2% by weight or less.

13. The composition according to claim 2, in which the content of sodium and iron is 20 ppb or less.

14. A method for producing a composition for a resist underlayer film comprising adding water to (A) at least one compound selected from the group consisting of (A-1) a compound represented by the following general formula (1):

$$R^1_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^3_b(R^4O)_{3-b}Si—(R^7)_d—Si(OR^5)_{3-c}R^6_c \quad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or —(CH$_2$)n—, d represents 0 or 1, and n represents an integer of 1 to 6, in an amount of 0.25 mole to 3 moles per mole of the total of alkoxyl groups of the compound represented by general formula (1) and alkoxyl groups of the compound represented by general formula (2), hydrolyzing and/or condensing said compound, wherein neither the compound of general formula (1) nor the compound of general formula (2) contains a glycidyl group, and then adding (B) a compound generating an acid by ultraviolet irradiation and/or heating,
wherein a resist underlayer film made with said composition changes 1 nm or less in thickness when immersed in a 2.38% aqueous solution of tetramethylammonium hydroxide for 1 minute.

15. The method according to claim 14, in which both or either of a hydrolysate and a condensate of a compound represented by the following general formula (3):

$$Si(OR^2)_4 \quad (3)$$

wherein $R^2$ represents a univalent organic group; and both or either of a hydrolysate and a condensate of a compound represented by the following general formula (4):

$$R^1_n Si(OR^2)_{4-n} \quad (4)$$

wherein $R^1$ and $R^2$, which may be the same or different, each represent univalent organic groups, and n represents an integer of 1 to 3, are mixed with each other to use them as said component (A).

16. The method according to claim 14, in which said component (A) is hydrolyzed and/or condensed in the presence of a solvent represented by the following general formula (5):

$$R^8O(R^{10}O)_e R^9 \quad (5)$$

wherein $R^8$ and $R^9$ each independently represent hydrogen atoms or univalent organic groups selected from the group consisting of alkyl groups each having 1 to 4 carbon atoms and CH$_3$CO—, $R^{10}$ represents an alkylene group having 2 to 4 carbon atoms, and e represents an integer of 1 or 2.

17. A method for producing a composition for a resist underlayer film comprising adding water to (A) at least one compound selected from the group consisting of (A-1) a compound represented by the following general formula (1):

$$R^1_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^9_b(R^4O)_{3-b}Si—(R^7)_d—Si(OR^5)_{3-c}R^6_c \quad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or —(CH$_2$)n—, d represents 0 or 1, and n represents an integer of 1 to 6, in an amount of 0.25 mole to 3 moles per mole of the total of alkoxyl groups of the compound represented by general formula (1) and alkoxyl groups of the compound represented by general formula (2), hydrolyzing and/or condensing said compound, and then adding (B) a compound generating an acid by ultraviolet irradiation and/or heating, in which both or either of a hydrolysate and a condensate of (a1) a compound represented by the following general formula (3):

$$Si(OR^2)_4 \quad (3)$$

wherein $R^2$ represents a univalent organic group; and both or either of a hydrolysate and a condensate obtained from mixing a compound (a1) and (a2) a compound represented by the following general formula (4):

$$R^1_n Si(OR^2)_{4-n} \quad (4)$$

wherein $R^1$ and $R^2$, which may be the same or different, each represent univalent organic groups, and n represents an integer of 1 to 3, followed by hydrolysis and condensation of the mixture; are mixed with each other to use them as said component (A).

18. The method according to claim 17, in which said catalyst is a chelate compound of titanium, aluminum or zirconium, or an organic acid.

19. A method for producing a composition for a resist underlayer film comprising adding water to (A) at least one compound selected from the group consisting of (A-1) a compound represented by the following general formula (1):

$$R^1_a Si(OR^2)_{4-a} \quad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^3_b(R^4O)_{3-b}Si—(R^7)_d—Si(OR^5)_{3-c}R^6_c \quad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or —(CH$_2$)n—, d represents 0 or 1, and n represents an integer of 1 to 6, in an amount of 0.25 mole to 3 moles per mole of the total of alkoxyl groups of the compound represented by general formula (1) and alkoxyl groups of the compound represented by general formula (2), hydrolyzing and/or condensing said compound, and then adding (B) a compound generating an acid by ultraviolet irradiation and/or heating, in which both or either of a hydrolysate and a condensate of (a1) a compound represented by the following general formula (3):

$$Si(OR^2)_4 \quad (3)$$

wherein $R^2$ represents a univalent organic group or either of a hydrolysate and a condensate obtained from mixing a compound (a1) and (a2) a compound represented by the following general formula (4):

$$R^1{}_n Si(OR^2)_{4-n} \qquad (4)$$

wherein $R^1$ and $R^2$, which may be the same of different, each represent univalent organic groups, and n represents an interger of 1 to 3, followed by hydrolysis and condensation of the mixture; are mixed with each other to use them as said component (A).

20. A method for producing a composition for a resist underlayer film comprising adding water to (A) at least one compound selected from the group consisting of (A-1) a compound represented by the following general formula (1):

$$R^1{}_a Si(OR^2)_{4-a} \qquad (1)$$

wherein $R^1$ represents a hydrogen atom, a fluorine atom or a univalent organic group, $R^2$ represents a univalent organic group, and a represents an integer of 0 to 2, and (A-2) a compound represented by the following general formula (2):

$$R^3{}_b(R^4O)_{3-b}Si-(R^7)_d-Si(OR^5)_{3-c}R^6{}_c \qquad (2)$$

wherein $R^3$, $R^4$, $R^5$ and $R^6$, which may be the same or different, each represent univalent organic groups, b and c, which may be the same or different, each represent integers of 0 to 2, $R^7$ represents an oxygen atom or —$(CH_2)n$—, d represents 0 or 1, and n represents an integer of 1 to 6, in an amount of 0.25 mole to 3 moles per mole of the total of alkoxyl groups of the compound represented by general formula (1) and alkoxyl groups of the compound represented by general formula (2), hydrolyzing and/or condensing said compound, wherein when any of $R^1$–$R^6$ is a univalent organic group, said univalent organic group is selected from the group consisting of alkyl, aryl and allyl, optionally substituted with halogen or amino, and then adding (B) a compound generating an acid by ultraviolet irradiation and/or heating, wherein a resist underlayer film made with said composition changes 1 nm or less in thickness when immersed in a 2.38% aqueous solution of tetramethylammonium hydroxide for 1 minute.

21. A resist underlayer film obtained by a method comprising adding water to (A) at least one compound selected from the group consisting of (A-1) a compound represented by the following formula (1):

$$R^1{}_a Si(OR^2)_{4-a} \qquad (1)$$

wherein $R^1$ represents a hydrogen atom, a flourine atom or a univalent organic group, $R^2$ represents a univalent organic group, and a represents an integer of 0 to 2, and (A-2) a compound represented by the following general formula (2):

$$R^3{}_b(R^4O)_{3-b}Si-(R^7)_d-Si(OR^5)_{3-c}R^6{}_c \qquad (2)$$

wherein $R^3$, $R^4$, $R^5$ and $R^6$, which may be the same or different, eacg represent univalent organic groups, b and c, which may be the same or different, each represent integers og 0 to 2, $R^7$ represents an oxygen atom or -$(CH_2)n$-, d represents 0 to 1, and n represents an integer of 1 to 6 , in an amount of 0.25 mole to about 3 moles per mole of the total of alkoxyl groups of the compound represented by the general formula (1) and alkoxyl groups of the compound represented by the general formula (2), hydrolyzing and/or condensing said compound, wherein neither the compound of general formula (1) nor the compound of general formula (2) contains a glycidyl group, and then adding (B) a compound generating an acid by ultraviolet irradiation and/or heating, wherein (A) and (B) are dissolved or dispersed in an organic solvent, and drying to form said resist underlayer film.

* * * * *

UNITED STATES PATENT AND TRADEMARK OFFICE
CERTIFICATE OF CORRECTION

PATENT NO. : 6,576,393 B1  Page 1 of 1
DATED : June 10, 2003
INVENTOR(S) : Sugita et al.

It is certified that error appears in the above-identified patent and that said Letters Patent is hereby corrected as shown below:

<u>Title page,</u>
Item [45] and the Notice information should read as follows:

-- [45]  **Date of Patent: \*Jun. 10, 2003**

[\*]  Notice:  This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Thirtieth Day of September, 2003

JAMES E. ROGAN
*Director of the United States Patent and Trademark Office*